United States Patent [19]

Ashcraft et al.

[11] Patent Number: 4,489,153
[45] Date of Patent: Dec. 18, 1984

[54] PROCESS FOR PREPARING A POSITIVE OVERLAY

[75] Inventors: Robert W. Ashcraft, Towanda; Jon G. Moehlmann, Sayre, both of Pa.

[73] Assignee: E. I. Du Pont de Nemours and Company, Wilmington, Del.

[21] Appl. No.: 564,380

[22] Filed: Dec. 22, 1983

[51] Int. Cl.³ .................... G03C 1/68; G03C 7/00; G03F 3/00
[52] U.S. Cl. .................... 430/253; 430/257
[58] Field of Search ............... 430/253, 257

[56] References Cited

U.S. PATENT DOCUMENTS

| | | | |
|---|---|---|---|
| 3,721,557 | 3/1973 | Inoue | 430/257 |
| 3,785,817 | 1/1974 | Kochta | 430/253 |
| 4,282,308 | 8/1981 | Cohen et al. | 430/271 |
| 4,316,951 | 2/1982 | Cohen et al. | 430/253 |

Primary Examiner—Richard L. Schilling

[57] ABSTRACT

Process for preparing a positive overlay using an imagewise exposed peel apart photosensitive element comprising a strippable cover sheet, photoadherent layer containing a colorant, a tacky, nonphotosensitive contiguous layer, and a support wherein after peeling apart the element bearing the contiguous layer and complementary colored unexposed areas is adhered to a transparent receptor, and the transparent and colored unexposed image adhered thereto are removed. By repeating the procedure with peel apart elements of different color and overlaying the images in register colored proofs are prepared.

7 Claims, 3 Drawing Figures

F I G. 1A
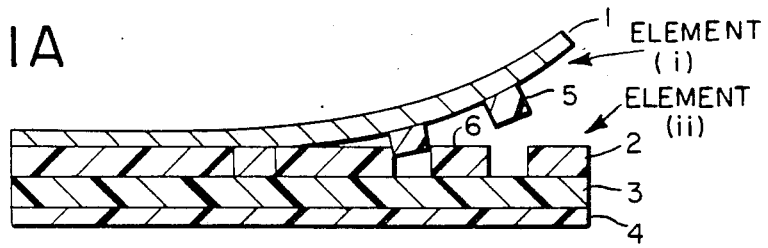
F I G. 1B
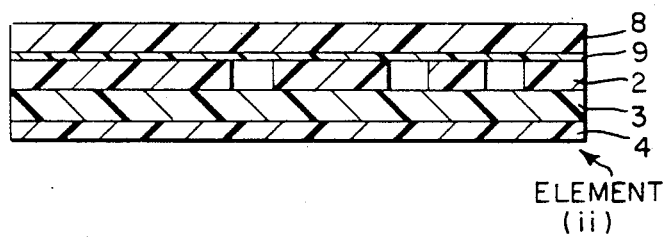
F I G. 1C
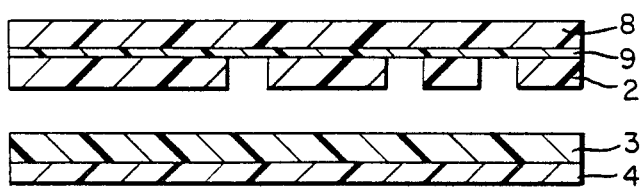

PROCESS FOR PREPARING A POSITIVE OVERLAY

DESCRIPTION

1. Technical Field

This invention relates to a process for preparing a positive overlay. More particularly this invention relates to a process for preparing a positive overlay using a peel apart photosensitive element comprising a strippable cover sheet, a photoadherent layer containing a colorant, a tacky, nonphotosensitive contiguous layer, and a support.

2. Background Art

Many photosensitive elements are known that are useful for the preparation of color proofs. After imagewise exposure the photosensitive elements may be developed by solvent or aqueous washout of soluble image areas, toning tacky image areas with a colorant, or a combination of washout and toning. In Cohen and Fan U.S. Pat. No. 4,282,308 there is described a photopolymerizable element which is capable of producing reverse colored images by a dry process without the need for toning with a colorant. The element comprises in order from top to bottom a strippable cover sheet, a photoadherent layer containing a colorant, a tacky nonphotosensitive contiguous layer, and a support. After imagewise exposure to actinic radiation through the cover sheet, the element can be peeled apart by removing the cover sheet with the exposed image areas adherent thereto thus forming a negative image. The peel force required to remove the cover sheet with the exposed photoadherent layer thereon from the contiguous layer is at least four times the peel force required to remove the cover sheet from an unexposed photoadherent layer. While the negative image is useful, the corresponding colored positive image left behind on the tacky contiguous layer is normally thrown away, because the contiguous layer is tacky and the photosensitive layer and its support are not optically clear.

It is therefore desirable to provide a method for preparing a colored positive image that can be used in conjunction with other colored positive images to make a positive overlay proof.

BRIEF DESCRIPTION OF THE DRAWINGS

In the accompanying Figures forming a part of this disclosure:

FIG. 1A illustrates a photosensitive element comprising a strippable cover sheet (1), a colored photoadherent layer (2), a contiguous layer (3) and a support (4). The exposed areas (5) of the photoadherent layer adhere to and are removed with the strippable cover sheet after imagewise exposure of the element to actinic radiation designated element (i) leaving unexposed colored areas (6) of the photoadherent layer remaining on the supported contiguous layer designated element (ii).

FIG. 1B illustrates a transparent receptor (8) having a polymeric adhesive layer 9 adhered to the surface of colored photoadherent layer (2).

FIG. 1C illustrates the separation of the transparent receptor (8) from the surface of element (ii) whereby the adhesive layer (9) and colored photoadherent layer (2) are retained adhered to the transparent receptor. This new element can be used as one image layer of an overlay proof. The other image layers can be prepared by repeating the process. Contiguous layer (3) and support (4) remaining from element (ii) are discarded.

DISCLOSURE OF THE INVENTION

In accordance with this invention there is provided a process for preparing a positive overlay which comprises:

(a) exposing through a separation positive image a peel-apart photosensitive element comprising in order from top to bottom, (1) a strippable cover sheet comprised of a polymeric film which is transparent to actinic radiation, (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the cover sheet (1) with the exposed photoadherent layer (2) thereon from the contiguous layer (3) is at least four times the peel force required to remove the cover sheet (1) from an unexposed photoadherent layer (2);

(b) peeling apart the exposed photosensitive element to form two elements; (i) cover sheet bearing on its surface colored exposed image areas, and (ii) sheet support bearing the contiguous layer having on its surface complementary colored unexposed image areas:

(c) adhering element (ii) to a transparent receptor;

(d) removing the transparent receptor and the colored unexposed image areas adhered thereto;

(e) repeating steps (a) to (d) at least one time; and (f) overlaying the images in register.

The process for preparing a positive overlay as described and claimed herein is a dry process. By "dry process" is meant a process in which liquids need not be used. The photoadherent layer, which is the sole photosensitive layer of the element, is one whose adhesive relationship between the cover sheet and the contiguous layer is altered by exposure to actinic radiation, so that after exposure the exposed areas of the photoadherent layer adhere more strongly to the cover sheet than to the contiguous layer and are removed with the cover sheet while the unexposed areas of the photoadherent layer adhere more strongly to the tacky contiguous layer than to the cover sheet.

Adhesive and cohesive force relationships of the layers are useful in characterizing the elements of this invention wherein $A_1$ represents the adhesive force between the cover sheet (1) and the unexposed photoadherent layer (2); $A_2$ represents the adhesive force between the unexposed photoadherent layer (2) and the tacky contiguous layer (3); and C represents the cohesive value of the unexposed photoadherent layer (2). Thus in the unexposed state $A_1$ is the lowest value, and the element will peel at the cover sheet/photoadherent layer interface. The force relationship may be represented by:

$$C > A_1 < < A_2$$

It has been found that upon imagewise exposure of the element, dramatic changes occur in adhesive and cohesive values. $A_1^*$ represents the adhesive force between exposed areas (5) of the photoadherent layer (2) and the cover sheet (1); $A_2^*$ represents the adhesive force between exposed areas (5) and the tacky contiguous layer (3); and $C^*$ represents the cohesive value of the photoadherent layer in the exposed areas (5). Thus in the exposed state $A_2^*$ is the lowest value while the cohesive value C of the unexposed areas also must be sufficiently low to allow a clean break in the photoadherent layer (2) at the interface between the exposed areas (5) and unexposed areas (6) to allow exposed areas (5) to be completely removed when the cover sheet is peeled away. The resulting force relationship may be represented by:

$$C < A_1^* > > A_2^* < C^*$$

The combined effect of these cohesive and adhesive values is measured by the force required to peel or remove the cover sheet at an angle of 180° from the surface of an element as a function of the amount of actinic exposure and the cover sheet removal rate. Although peel force increases with increasing cover sheet removal rate, this increase is relatively small in the range of above 600 inches/minute (524 cm/minute). Typically for elements of this invention peel force in the exposed areas, $A_2^*$, is dramatically higher than in the unexposed areas, $A_1$, i.e., at least four times higher and preferably at least an order of magnitude difference. Surprisingly, these elements also show greatly improved image fidelity and tonal range. Thus in the unexposed state, the peel force to remove the cover sheet is very low and separation occurs at the interface between the cover sheet and the photoadherent layer and is equivalent to adhesive force $A_1$. For this invention adhesive forces $A_1$, typically are below 20 g/inch (~7.9 g/cm) and are generally between 5 and 10 g/inch (~1.97 and ~3.94 g/cm). Upon exposure, following the induction period, photopolymerization or photoadhesion starts and peel force values increase rapidly with continued exposure. At intermediate exposures where polymerization of the photoadherent layer is insufficient the separation occurs at intermediate points in the photoadherent layer and does not give a good image. At the correct exposure level, however, the locus of failure shifts to the interface between the exposed photoadherent layer and the contiguous layer. The peel force at this point reaches a plateau and remains substantially constant over an extensive exposure range. Peel forces in the plateau regions are equivalent to adhesive forces $A_2^*$. For this invention adhesive forces $A_2^*$ are typically above 80 g/inch (~31.5 g/cm), and preferably are between 100 g/inch (39.37 g/cm) and 700 g/inch (275.59 g/cm). Thus the ratio of adhesive forces for exposure to unexposed elements, i.e., ($A_2^*/A_1$) is at least 4, and preferably between 10 and 100 or above. By comparison, peel forces reported from previous peel apart systems such as disclosed in the publication "Image Formation By Photoadhesion" by Woodruff et al., Photographic Science and Engineering, Vol. 11, No. 2, pp. 93–97 March–April 1967, U.S. Pat. Nos. 3,353,955, 3,607,264 and 3,754,920 are typically below about 20 g/inch (~7.9 g/cm) with ratios of peel forces between exposed and unexposed layers being about 2 or less.

The strippable cover sheet of the element of the invention must be strippable (i.e., removable by peeling it apart) frm the rest of the element, carrying with it only the exposed areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. In order to make the exposed areas of the photoadherent layer adhere better to the cover sheet, the cover sheet's surface may be modified; for example, the topography may be altered and the polarity increased by a surface treatment such as electrostatic discharge or flame treatment. In the case of a polyethylene terephthalate film having a thickness of 0.005 inch (~0.013 mm), an electrostatic discharge of at least 0.025 coulomb/ft² (0.272 coulomb/m²) and preferably about 0.07 coulomb/ft² (0.762 coulomb/m²) is suitable. However, increased treatments may be used. Flame treatment of the film also will provide good photoadhesion. An air-propane flame may be used.

While the thickness of the cover sheet may be varied over a wide range, films having a thickness of 0.001 inch (0.25 mm) or less are particularly preferred. Thin cover sheets produce halftone dots of good roundness with sharp edges. In addition, a tonal range of 2–98% dot resolution (using halftone screen with 150 lines/inch) and a rapid rate of cover sheet strippability, e.g., up to 9,000 inches/minute (22,860 cm/minute) or higher, is obtainable with thin cover films. By "tonal range" is meant the range of sizes of resolvable halftone dots as a percentage of a maximum dot size. In general, a rapid rate of cover sheet stripping produces better image quality. The cover sheet should be thick enough so that electrostatic discharge or flame treatment will not injure it and so that it may be stripped without tearing. The cover sheet may additionally comprise auxiliary treatments or layers to improve adhesion, strength, and other properties.

After imagewise exposure of the peel apart photosensitive element to actinic radiation, the exposed areas of the photoadherent layer adhere more strongly to the cover sheet than to the contiguous layer in the exposed areas and more strongly to the contiguous layer than to the cover sheet in the unexposed areas. Photohardenable materials are used for the photoadherent layer. Such materials are usually comprised of a material with ethylenically unsaturated or benzophenone-type groups in which an increase in molecular weight and, consequently, an increase in adherence to the cover sheet are caused by exposure to actinic radiation. The well-known photohardenable materials which are comprised of an ethylenically unsaturated material which is photopolymerizable, photocrosslinkable, photodimerizable or combinations thereof are preferred. Such materials are described, for example, in Chu et al., U.S. Pat. No. 3,649,268. Particularly preferred are photopolymerizable compositions comprised of a macromolecular organic polymer binder and an addition polymerizable ethylenically unsaturated monomer. The binder can be a polar material such as an acidic polymer containing at least 1.5 mole percent free acid groups to impart polarity to the polymer, or a nonpolar material, e.g., materials as described in U.S. Pat. Nos. 3,060,023, 3,649,268, and 3,984,244. The monomer has at least one and preferably two or more terminal ethylenically unsaturated groups capable of free-radical initiated, chain propagated addition polymerization, said monomer preferably having some degree of polarity and being compatible with the binder and with the polar surface of the cover sheet, but substantially nondiffusible in the contiguous layer. The photopolymerizable composition will also contain a free-radical generating addition polymerization photoinitiating system (i.e., at least one organic photoinitiator compound) activatable by actinic radiation, e.g., ultraviolet and visible radiation.

Among acidic binders which have been found useful, there may be mentioned co(methyl methacrylate/methacrylic acid) and monoethyl ester of poly(methyl vinyl ether/maleic anhydride), each of which may be copolymerized in various proportions. Many other polar polymers and copolymers known in the art will be found useful as a binder in the photopolymerizable layer. Among the ethylenically unsaturated monomers which have been found useful are those disclosed in Plambeck, U.S. Pat. No. 2,760,863; Cohen and Schoenthaler, U.S. Pat. No. 3,380,831 and Chambers and Woodward U.S. Pat. No. 3,573,918. There may be mentioned as examples dipentaerythritol acrylate (50% tetra and 50% penta), pentaerythritol triacrylate and tetraacrylate, polypropylene glycol (50) ether of pentaerythritol tetraacrylate, polyethylene glycol (200) dimethacrylate, dipentaerythritol monohydroxy pentaacrylate, pentaerythritol triacrylate β-hydroxyethyl ether, polypropylene glycol (550) ether of pentaerythritol tetraacrylate, pentaerythirtol tetramethacrylate, polypropylene glycol (425) dimethacrylate, trimethylolpropane trimethacrylate, and polypropylene glycol (340) ether or trimethylol propane triacrylate. Also useful are epoxy monomers containing ethylene unsaturation, e.g. monomers of the type disclosed in U.S. Pat. No. 3,661,576 and British Pat. No. 1,006,587. The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made in accordance with the requirements of selective photoadherence and hardness. In order to provide a suitable hardness, the monomer concentration is normally kept low so that the layer coated from the composition will be sufficiently hard and non-tacky.

The free-radical generating addition polymerization initiating systems activatable by actinic radiation may be, for example, any of those disclosed in Notley, U.S. Pat. No. 2,951,752; Chang and Fan, U.S. Pat. No. 3,549,367; Fan, U.S. Pat. No. 3,558,322; and Chang, U.S. Pat. No. 3,926,643. Other particularly useful initiating systems are disclosed in Cescon et al., U.S. Pat. No. 3,615,454; Grubb, U.S. Pat. No. 3,647,467; Baum et al., U.S. Pat. No. 3,652,275; Chang, U.S. Pat. No. 3,661,558; and Strilko, U.S. Pat. No. 3,697,280. Sensitizers such as 4,4'-diethylamino benzophenone, 7-diethylamino-4-methyl coumarin, etc. can be present. The photopolymerizable layer may also contain other ingredients including plasticizers, antihalation agents and optical brightening agents. By the incorporation of optical brightening agents in the photoadherent layer, the image record is produced free from distortion due to halation effects and free from discoloration due to element components. Suitable optical brighteners can be found in Keller, U.S. Pat. No. 2,784,183 and Gurney, U.S. Pat. No. 3,644,394. Specific brightener compounds which are particularly useful in the photopolymerizable layers of this invention are 2-(stilbyl-4")-(naphtho-1',2',4,5)-1,2,3-triazol-2"-sulfonic acid phenyl ester and 7-(4'-chloro-6'-diethyl aminol-1', -3,5'-triazine-4'-yl) amino-3-phenyl-coumarin.

The photoadherent layer is colored with a suitable colorant. Many type dyes or pigments can be used provided they are compatible with the photoadherent composition. Typical colorants used in color proofing are yellow, magenta, cyan and preferably black. Pigments useful in the stated colored layers are: yellow: Cromophtal®Yellow 3G (C.I. No. Pigment Yellow 93), Hostaperm®Yellow 3G (C.I. No. Pigment Yellow 154), etc.; magenta; Monastral®Violet R (C.I. No. Pigment Violet 19), 2,9-Dimethylquinacridone (C.I. No. Pigment Red 122), Indofast®Brilliant Scarlet R6300 (C.I. No. Pigment Red 123), etc.; cyan: Monastral®Blue G (C.I. Pigment Blue 15), Monastral®Blue (BT 383D) (C.I. No. Pigment Blue 15), Monastral®Blue G (BT 284D) (C.I. No. Pigment Blue 15), Monastral®Green GT 751D (C.I. No. Pigment Green 7), etc.; black: Raven®450 (C.I. No. Pigment Black 7), Raven®1035 (C.I. No. Pigment Black 7), Elftex®8 (C.I. No. Pigment Black 7), Elftex®12 (C.I. No. Pigment Black 7), etc.

While the coating weight of the photoadherent composition may be varied, it has been found that a preferred range from 20–100 mg/dm$^2$ (providing a dry layer thickness of about 0.00006–0.00033 inch (0.0015–0.0084 mm) will give good image quality and tonable range.

The contiguous layer may be chosen from a great number of materials. The contiguous layer is a nonphotosensitive tacky or slightly soft deformable organic material and generally is colorless. For an element with good aging stability, suitable materials for the contiguous layer should restrain monomer diffusion from the photoadherent layer into the contiguous layer. Such materials may be selected from resins, polymers in which monomer of the photoadherent layer is substantially nondiffusible, adhesive compositions, etc. Particularly preferred materials are elastomeric polymers and mixtures thereof having a second order transition temperature of −10° C. or lower which are inherently tacky or will accept tackifying agents and which are nonmigratory into said photadherent layer and which will impart tackiness to the layer. Rubber type polymers, both natural and synthetic may be used, e.g., isobutylene, Thiokol A, nitrile rubbers, butyl rubber, chlorinated rubbers, polymers of butadiene, isoprene, poly(vinylisobutylether), and random, teleblock and block copolymers of butadiene or isoprene copolymerized with styrene, and neoprene, silicone elastomers etc., in various proportions. With these materials, a stable adhesion balance between the photoadherent layer and a support for the contiguous layer, in a preferred element, may be achieved for elements useful in making color proofs by the overlay method.

Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch (0.0038 mm)) will be satisfactory. The contiguous layer may also be coated as a dispersion, e.g., an aqueous dispersion with satisfactory results.

As illustrated in the drawings, the element has a support (4) for the contiguous layer (3). The support (4) may be any suitable film which has the necessary characteristics for the proper adhesion to layer (3). For color proofing by the overlay method, photographic grade polyethylene terephthalate films which may or may not contain an anchoring layer such as those disclosed in Alles, U.S. Pat. No. 2,779,684 may be used in the overlay method.

The manufacture of the above-described elements may be accomplished in several different ways. For example, the photoadherent layer (2) may be coated on the cover sheet (1) and then after drying, contiguous layer (3) is coated from a solvent solution and then after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat contiguous layer (3) onto a support (4) and then after drying the coated layers, laminating the surfaces of layers (2) and (3) under pressure at room temperature or elevated temperature. Layers (2) and (3) may also be coated simultaneously in order on support (1) and then a support (4) may be laminated to the outer surface of layer (3). All of these methods are known to those skilled in the art of coating multilayer films.

In using the photosensitive elements of this invention for making a color proofing image of the overlay type, the elements are exposed to conventional halftone color separation positives by means of actinic radiation to which the photoadherent layer is most sensitive, e.g., a carbon arc which is rich in ultraviolet radiation. Other radiation sources which may be used include mercury vapor or pulsed xenon lamps and lasers. The exposed elements are then delaminated at room temperature by stripping with a moderate to rapid continuous motion the cover sheet (1) from the element at an angle of generally at least 135° forming two elements: (i) cover sheet bearing on its surface colored exposed image areas, and (ii) sheet support bearing the contiguous layer having on its surface complementary colored unexposed image areas. Element (ii), useful in the process of this invention is then adhered to the surface of a transparent receptor. This can be accomplished in several ways. An adhesive composition which should have no harmful effect on the surface with which it comes in contact can be applied in a thin layer either to the colored surface of element (ii), to the surface of the transparent receptor, or to both surfaces. Suitable adhesives are polymeric coatings such as polyvinylacetate, poly(methylmethacrylate/ethylacrylate/acrylic acid) (55/38/7, 37/55/8), poly(vinyl chloride/vinylacetate), poly(ethylene/vinyl acetate/acrylic acid), poly(n-butyl methacrylate), poly(n-butyl-methacrylate/methylmethacrylate, etc. Suitable transparent receptors are films of polyethylene terephthalate surface treated by electrostatic discharge or flame treatment, electrostatic discharge treated polypropylene or polyethylene, adherable-subbed polyethylene terephthalate, untreated polyethylene terephthalate or polypropylene, etc.

In a preferred embodiment of the process, the transparent receptor bearing a layer of polymeric adhesive is adhered to the colored image surface of element (ii) by lamination at ambient conditions. In the embodiment where a layer of polymeric adhesive is present on the colored image surface the transparent receptor is brought in contact with and adhered to said surface. Adhering element (ii) to the transparent receptor is normally done at room temperature conditions but heat can be applied provided that the temperature does not affect or degrade the colored image surface.

The transparent receptor is then removed by stripping or peeling with the colored unexposed image areas remaining adhered thereto. This operation is also normally accomplished at ambient conditions. The sheet support and contiguous layer of element (ii) not transferred to the transparent receptor are discarded. The colored image on the transparent receptor is one of the images used in an overlay to form a colored proof. By repeating the process there are produced separate color records or images which are assembled in register in any desired order to give a three or four color proof. The colors present in element (ii) are yellow, magenta and cyan where three colors are used. Black is the fourth color and usually is included in preparing a colored proof. A preferred mode is illustrated in Example 1 below.

INDUSTRIAL APPLICABILITY

The process of this invention is useful in preparing positive overlay proofs by a dry method which involves peeling and laminating or adhering. After imagewise exposure and peeling apart of the described photosensitive multilayer element, the sheet support bearing the contiguous layer having on its surface complementary colored unexposed image areas is adhered to a transparent receptor. Removing the transparent receptor and the colored unexposed image areas adhered thereto results in a colored image useful in the overlay. By repeating the process up to 3 times using photosensitive elements having different colors present in the photoadherent layer, the different colored images can be placed in register over its preceding colored image and a 3- or 4-colored proof obtained.

By the process of the invention two different images can be formed on one receptor. Two images can be formed on the same receptor by adhering the colored image surface and separating two times provided that the images do not overlap. If there is overlap of the images, to the first image on the receptor there is applied a layer of polymeric adhesive composition prior to transfer of the second image.

EXAMPLES

The following examples illustrate the invention wherein the parts and percentages are by weight. The molecular weights of the polymers are expressed as number average molecular weights ($\overline{M}n$). The $\overline{M}n$ for the polymers described herein can be determined by gel permeation chromatography employing a polybutadiene or other polymer standard.

EXAMPLE 1

Precolored, peel-apart photosensitive elements are prepared as follows:

I. Colored Photoadherent Layer: Photopolymerizable Coating Composition

For the photoadherent layer, a coating solution of a photopolymerizable composition was prepared by mixing together the following ingredients for each respective color:

| Ingredients | Amount (%) | | | |
|---|---|---|---|---|
| | Yellow | Magenta | Cyan | Black |
| Pigment (described below)[1] | 9.00 | 8.93 | 4.37 | 11.18 |
| Polymethylmethacrylate (inherent viscosity - 0.25 g polymer in 50 ml chloroform, 20° C., No. 50 Cannon-Fenske Viscometer is 1.38) | 39.38 | 37.17 | 44.80 | 38.89 |
| Polymethylmethacrylate/ | 2.25 | 4.53 | 1.46 | 5.59 |

-continued

| Ingredients | Amount (%) | | | |
|---|---|---|---|---|
| | Yellow | Magenta | Cyan | Black |
| 2-ethylhexyl acrylate (63/37), Desmodur ® N $\overline{Mn}$ 9000 | | | | |
| Methacrylated epoxy monomer (adduct of bis-phenol A, epichlorohydrin, methacrylic acid) | 39.85 | 39.85 | 39.85 | 37.17 |
| (2-o-chlorophenyl-4,5,diphenyl imidazolyl) dimer | 3.00 | 3.00 | 3.00 | 2.65 |
| 2-mercapto-benzoxazole | 1.72 | 1.72 | 1.72 | 1.72 |
| 4,4'-diethylamino-benzophenone | 2.00 | 2.00 | 2.00 | 2.00 |
| Brightener[2] | 2.00 | 2.00 | 2.00 | 2.00 |
| Poly(ethylene oxide) $\overline{Mn}$ 300,000 | 0.70 | 0.70 | 0.70 | 0.70 |
| Fluorad ® FC430, liquid nonionic surfactant, 3M Co. | 0.1 | 0.1 | 0.1 | 0.1 |

[1] yellow: Cromophtal ® Yellow 3G, C.I. No. Pigment Yellow 93
magenta: Monastral ® Violet R, C.I. No. Pigment Violet 19
cyan: Monastral ® Blue G (BT 383D), C.I. No. Pigment Blue 15
black: Raven ® 450, C.I. No. Pigment Black 7
[2] 2-(stilbyl-4"-)-(naphtho-1',3',4,5)-1,2,3-triazol-2" sulfonic acid phenyl ester Samples of polyethylene terephthalate film having a thickness of 50 microns which had been surface treated by electrostatic discharge at 0.05 coulomb/ft$^2$ (0.544 coulomb/m$^2$) were coated with each of the above solutions (12% in methylene chloride) at a coating weight of ~40 mg/dm$^2$ when dried.

II. Contiguous Layer: Tacky Elastomer Coating Composition

A coating solution was prepared by mixing together the following ingredients:

| | |
|---|---|
| Styrene-isoprene block copolymer (12/86) Brookfield viscosity - 20%, 77° F. toluene - 1600 cps | 99.5% |
| Tetra-bis methylene 3-(3,5-ditert-butyl-4-hydroxyphenyl) propionate methane. | 0.5% |

The solution was coated on a polyethylene terephthalate support having a thickness of 75 microns to give a coating weight of ~100 mg/dm$^2$ when dried.

III. Laminating Procedure

The coated photopolymerizable layer elements (I) and the tacky layer elements (II) were laminated in surface to surface relationship at room temperature with a pressure of ~40 psi (~28,000 K/m$^2$).

Yellow, magenta, cyan, and black precolored peel-apart photosensitive elements, described above, were exposed through their respective halftone color separation positives by means of a 5 kilowatt mercury lamp (Violux ®5002-S sold by Exposure Systems Company, Bridgeport, Conn) for 40 seconds at 54 inches (~140 cm) from the lamp. Each photosensitive element was then peeled apart at an angle of 180° at a rate of about 3500 inches/minute (~9,000 cm/minute) to form two elements: (i) a coversheet bearing on its surface colored exposed image areas, and (ii) a sheet support bearing a contiguous layer, having on its surface the complementary colored image areas. The peel force of a test sample is about 400 g/inch (157.5 g/cm). The colored image on element (ii) was a positive image, duplicating the positive halftone through which it was exposed.

Element (ii) was then laminated with a hot roll laminator operated at 250° F. (121° C.) to the coated side of a transparent receptor. The receptor consisted of a 0.002 inch (0.051 mm) thick sheet of polyethylene terephthalate which had been surface treated by electrostatic discharge at 0.05 coulomb/ft$^2$ (0.544 coulomb/m$^2$) and coated with polyvinylacetate ($\overline{Mn}$=86,000, manufactured by Air Products and Chemicals Co., Allentown, PA) at a coating weight of 87 mg/dm$^2$. The receptor sheet was then peeled off at an angle of about 180° and a rate of about 700 inches (275.59 cm) per minute, removing with it the colored image.

Each of the four colored images was transferred to its own separate receptor sheet in the manner described above. A positive overlay proof was then made by stacking in register the four receptor sheets, each bearing its own colored image.

EXAMPLE 2

Example 1 was repeated except that the coating on the transparent receptor consisted of poly(methyl methacrylate/ethyl acrylate/acrylic acid) (55/38/7, $\overline{Mn}$=42,000, manufactured by B. F. Goodrich, Akron, Ohio) at a coating weight of 61 mg/dm$^2$. Satisfactory overlay proofs were made using this receptor sheet.

EXAMPLE 3

Example 1 was repeated except that the coating on the transparent receptor consisted of poly(methyl methacrylate/ethyl acrylate/acrylic acid) (37/55/8, $\overline{Mn}$=260,000, manufactured by B. F. Goodrich, Akron, Ohio) at a coating weight of 51 mg/dm$^2$. Satisfactory overlay proofs were made using this receptor sheet.

EXAMPLES 4 and 5

Examples 1 and 2 were repeated, except that the electrostatic treated polyethylene terephthalate sheet in the transparent receptor was replaced with a proprietary adherable-subbed polyethylene terephthalate sheet sold as Melinex ®505 manufactured by ICI Americas, Wilmington, DE. Satisfactory overlay proofs were made using these receptors.

EXAMPLE 6

Example 2 was repeated, but after transferring one colored image to the transparent receptor sheet, the same procedure was used to transfer a second image to the receptor sheet containing the colored image in a location where it did not overlap the first image. This illustrates a method for adding images of the same or different color to an existing receptor sheet already bearing an image.

EXAMPLE 7

This example illustrates an alternate sequence of steps for making a positive overlay proof.

As in Example 1, yellow, magenta, cyan and black precolored peel-apart photosensitive elements were imaged and peeled apart. Element (ii), defined in Example 1, was the laminated with a hot roll laminator operated at 250° F. (121° C.) to a transfer film. The transfer film consisted of a 75 mg/dm$^2$ coating of polyvinylacetate resin described in Example 1 on a carrier sheet. The carrier sheet was polyethylene terephthalate that had a releasable layer of poly(dimethylsiloxane) coated thereon to give a coating weight of 100 mg/dm² when dry. The polyethylene terephthalate with the polydimethyl siloxane coating was then peeled off, leaving the polyvinylacetate coating attached to Element (II).

A receptor sheet consisting only of electrostatic discharge treated polyethylene terephthalate, 0.05 coulomb/ft² (0.544 coulomb/m²) was then laminated to the polyvinylacetate surface using a hot roll laminator operated at 250° F. (121° C.). The receptor sheet was then peeled off at an angle of about 180° and a rate of about 700 in/min (275.59 cm) removing with it the colored image.

A positive overlay proof was then made by stacking in register the four receptor sheets, each bearing its own colored image.

We claim:

1. Process for preparing a positive overlay which comprises
   (a) exposing through a separation positive image a peel-apart photosensitive element comprising in order from top to bottom, (1) a strippable cover sheet comprised of a polymeric film which is transparent to actinic radiation, (2) a photoadherent layer containing a colorant and comprising a photohardenable material with ethylenically unsaturated or benzophenone type groups, (3) a nonphotosensitive organic contiguous layer, and (4) a sheet support, wherein, after exposure to actinic radiation, the peel force required to remove the cover sheet (1) with the exposed photoadherent layer (2) thereon from the contiguous layer (3) is at least four times the peel force required to remove the cover sheet (1) from an unexposed photoadherent layer (2);
   (b) peeling apart the exposed photosensitive element to form two elements: (i) cover sheet bearing on its surface colored exposed image areas, and (ii) sheet support bearing the contiguous layer having on its surface complementary colored unexposed image areas;
   (c) adhering element (ii) to a transparent receptor;
   (d) removing the transparent receptor and the colored unexposed image areas adhered thereto;
   (e) repeating steps (a) to (d) at least one time; and
   (f) overlaying the images in register.

2. Process according to claim 1 wherein prior to step (c) to the surface of element (ii) is applied an adhesive.

3. Process according to claim 1 wherein the transparent receptor having an adhesive coating and element (ii) are adhered by lamination.

4. Process according to claim 1 wherein the transparent receptor is a polymeric film which is surface treated by electrostatic discharge or flame treatment.

5. Process according to claim 1 wherein element (ii) is adhered to the transparent receptor with a polyvinylacetate adhesive.

6. Process according to claim 1 wherein the overlay comprises, in combination, at least two images in register with each other, each image being prepared by exposing through a different color separation positive and the respective photoadherent layers have been colored in a spectral region corresponding to the color separation positive used for the exposure.

7. Process according to claim 6 wherein colored photoadherent layers and colored separation positives correspond, respectively, to black, yellow, magenta and cyan.

* * * * *